(12) United States Patent
Mouli

(10) Patent No.: US 6,772,035 B2
(45) Date of Patent: Aug. 3, 2004

(54) SYNTHESIZING SEMICONDUCTOR PROCESS FLOW MODELS

(75) Inventor: Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 10/150,988

(22) Filed: May 17, 2002

(65) Prior Publication Data

US 2003/0216827 A1 Nov. 20, 2003

(51) Int. Cl.$^7$ .............................................. G06F 19/00
(52) U.S. Cl. ...................... 700/121; 700/29; 700/103; 703/6
(58) Field of Search ........................... 700/90, 95, 103, 700/108, 121, 28, 29; 702/84; 438/14; 703/22, 6

(56) References Cited

U.S. PATENT DOCUMENTS

| | | | | |
|---|---|---|---|---|
| 5,661,669 A | * | 8/1997 | Mozumder et al. | 702/84 |
| 6,069,485 A | * | 5/2000 | Long et al. | 324/769 |
| 6,368,883 B1 | * | 4/2002 | Bode et al. | 438/14 |
| 6,526,547 B2 | * | 2/2003 | Breiner et al. | 716/4 |
| 6,535,774 B1 | * | 3/2003 | Bode et al. | 700/109 |
| 6,560,503 B1 | * | 5/2003 | Toprac et al. | 700/108 |
| 6,622,059 B1 | * | 9/2003 | Toprac et al. | 700/121 |

OTHER PUBLICATIONS

Harold Chestnut, System Engineering Tools, 1965, John Wiley & Sons, Inc., p. 137.*

Shimon Coean and Michael Wang–Ho Yu, *The Inverse Problem of the Direct Current Conductivity Profile of a Layered Earth*, Geophysics, vol. 46, No. 12, pp. 1702–1713, Dec. 1981.

R.H.T. Bates et al., *Overview of Computerized Tomography with Emphasis on Future Developments*, Proceedings of the IEEE, vol. 71, No. 3, pp. 356–372, Mar. 1983.

Kyriakos Doganis et al., *General Optimization and Extraction of IC Device Model Parameters*, IEEE Transactions on Electron Devices, vol. ED–30, No. 9, pp. 1219–1228, Sep. 1983.

A.G. Tijhuis, *Electronmagnetic Inverse Profiling: Theory and Numerical Implementation*, VNU Science Press, Utrecht, pp. xiv and 311–386, 1987.

Zachary K. Lee, *Two–Dimensional Doping Profile Characterization of MOSFET's by Inerse Modeling Using I–V Characteristics in the Subthreshold Region*, IEEE Transactions or Electron Devices, vol. 46, No. 8, pp. 1640–1649, Aug. 1999.

Chandra V. Mouli, *Models and methods: Effective use of Technology–Computed Aided Design in the Industry*, American Vacuum Society, J.Vac.Sci Technol. B 18(1), pp. 354–360, Jan./Feb. 2000.

W. R. Richards et al., *Extraction of Two–Dimensional Metal—Oxide—Semiconductor Field Effect Transistor Structural Information from Electrical Characteristics*, American Vacuum Society, J.Vac. Sci. Technol. B18(1), pp. 533–539, Jan./Feb. 2000.

* cited by examiner

Primary Examiner—Jayprakash N. Gandhi
(74) Attorney, Agent, or Firm—Fish & Neave; Andrew Van Court

(57) ABSTRACT

Systems and methods of modeling a best-guess semiconductor process flow for fabricating a desired semiconductor device are provided. The best-guess process flow is modeled using an inverse modeling technique. This technique reverse engineers a desired semiconductor device to synthesize a model of a fabrication process that is likely to produce the desired semiconductor device. First, a desired device having one or more desired characteristics is modeled. Then, various process and material parameters, constraints, and actual measured data are used to synthesize one or more unique software models that represent a process flow likely to fabricate the desired device. If more than one process flow is modeled, various parameters are modified iteratively until a unique process flow model is synthesized.

93 Claims, 3 Drawing Sheets

SYNTHESIZING SEMICONDUCTOR PROCESS FLOW MODELS

BACKGROUND OF THE INVENTION

This invention relates to synthesizing software models of semiconductor process flows that are most likely able to fabricate desired semiconductor devices. More particularly, this invention relates to synthesizing such semiconductor process flow models using inverse modeling techniques.

The production of semiconductor devices involves a fabrication process. A fabrication process involves many variables, such as, for example, dopant concentrations and distributions in a semiconductor, environmental conditions (e.g., humidity, temperature, and cleanliness), physical parameters (e.g., film thicknesses, wafer sizes, device sizes, and numbers of layers), and electrical parameters (e.g., AC and DC characteristics, threshold voltages, transconductances, and capacitances). Needless to say, manually selecting particular combinations of variables or particular values for such variables when attempting to determine a particular process flow for fabricating a desired device or device characteristic is extremely complex with little assurance of success.

Thus, prior to fabricating a desired semiconductor device or desired characteristic, a potential process flow is typically modeled in software and then simulated. A process flow embodies each step of a fabrication or manufacturing process. Process flow modeling is often done because actual fabrication runs are expensive and time consuming, thus rendering a trial-and-error approach impractical. Modeling helps predict which potential process flows are most likely able to produce a device having desired characteristics. Thus, by modeling potential process flows, unnecessary and costly fabrication runs can be avoided.

Process flows are typically modeled using a physical model and a given set of modeling parameters. Physical models typically embody the physical, electrical, and other tangible properties of a particular device that has already been fabricated. This approach, however, has several problems. One problem is that the parameters provided to the process model may be inaccurate or insufficient. This can occur when a user does not have data that sufficiently characterizes the device to be fabricated. The process modeling tool may not then be able to accurately model a process flow.

Another problem is that the physical models themselves are often inaccurate. Models may be plagued with inaccuracies because technological advances typically progress faster than the actual understanding of the technology. This may make it difficult to construct models that accurately simulate process flows that can be used to produce desired devices.

The effects of these problems may be mitigated, if not rendered negligible, by using an inverse modeling technique. An inverse modeling technique uses "reverse engineering" to develop (or synthesize) a process that can fabricate a desired device. This technique has been used in the fields of geophysics, electromagnetism, and biotechnology. However, inverse modeling in the field of semiconductor fabrication has been at best limited.

In view of the foregoing, it would be desirable to synthesize semiconductor process flow models using an inverse modeling technique.

SUMMARY OF THE INVENTION

It is an object of this invention to synthesize semiconductor process flow models using an inverse modeling technique.

In accordance with this invention, semiconductor process flow models for fabricating desired semiconductor devices are synthesized using an inverse modeling technique. Inverse modeling, as opposed to conventional modeling, first models a desired device having desired characteristics (e.g., a transistor having properties for low voltage turn-ON and rapid frequency response). Inputs to this device modeling stage include measured data from previously fabricated devices, data from previously modeled process flows, desired characteristics from circuit designers, physical model parameters, and various numerical techniques and calibration methodologies that manipulate data.

After the desired device is modeled, various parameters are extracted from the modeled device. Extracted parameters may include, for example, structural characteristics (e.g., topography and film thickness), dopant levels, electrical characteristics (e.g., effective channel length and activation energy). These parameters are provided as inputs to a process modeling stage. This modeling stage also receives inputs that include best-guess modeled process flow information from previous process flow model simulations. The process modeling stage also iterates through an optimization loop, which optimizes modeled process flows in accordance with various constraints derived from the extracted parameters (e.g., design criteria), known fabrication processes (e.g., reliability and yield criteria), and known software tools (e.g., various tool limitations).

One or more process flows (i.e., process flows with different sets of parameters or ranges of parameters) that should be capable of fabricating the desired semiconductor device may be modeled by the process modeling stage. If more than one process flow is modeled, the constraints used to optimize the process flows are then modified iteratively until a unique process flow model is synthesized at the process modeling stage.

The resulting unique process flow model can then be simulated to fine tune or trade off selection of certain process parameters or variables. Upon satisfactory simulation results, an experimental fabrication run based on the modeled process flow can then be made. Measured data from the experimentally-fabricated devices can be fed back to the device and process modeling stages to further refine or modify the modeled process flow before a next experimental fabrication run is made.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

A process flow is a process or method used in manufacturing a semiconductor device. The process flow embodies each step used in fabricating such devices. The complexity of a process flow may vary. Complex process flows are often required to produce integrated circuits. Simpler process flows may be used to fabricate specific portions of an integrated circuit (e.g., the gate-oxide thickness of a transistor). Regardless of the complexity, a process flow is typically modeled and simulated in a computer before it is put into practice.

Computer simulated process flows are preferably modeled using technology computer-aided design (TCAD) tools in accordance with the invention. TCAD tools provide a user with the ability to model several different variations of a process flow early in the design stage before the flow is implemented in a fabrication run. These tools are useful because fabrication runs are expensive and time consuming. A TCAD tool according to the invention may include, for example, the University of Texas Marlowe Implant Modeling Tool available from the University of Texas at Austin. Other embodiments of TCAD tools may include commercial software packages such as ATHENA™ and ATLAS™ sold by Silvaco International, of Santa Clara, Calif. Persons skilled in the art will appreciate that software packages other than those described above can be used in conjunction with the invention.

The invention uses an inverse modeling technique to determine a best-guess process flow suitable for use in fabricating a desired device. The inverse modeling technique of the invention is based on known characteristics of a desired finished product. This technique develops or predicts a process flow that can fabricate a device exhibiting substantially each of the desired characteristics. A simple illustration of this technique is as follows: a user wishes to model a process to fabricate a transistor (e.g., a complementary metal oxide semiconductor). Before the process of modeling a transistor begins, the user knows the desired parameters (e.g., physical dimensions such as gate length and electrical properties such as turn-ON voltage) and characteristics. Using these parameters, the user can construct a transistor model that will be suitable for fabricating the desired transistor.

Figure 1:
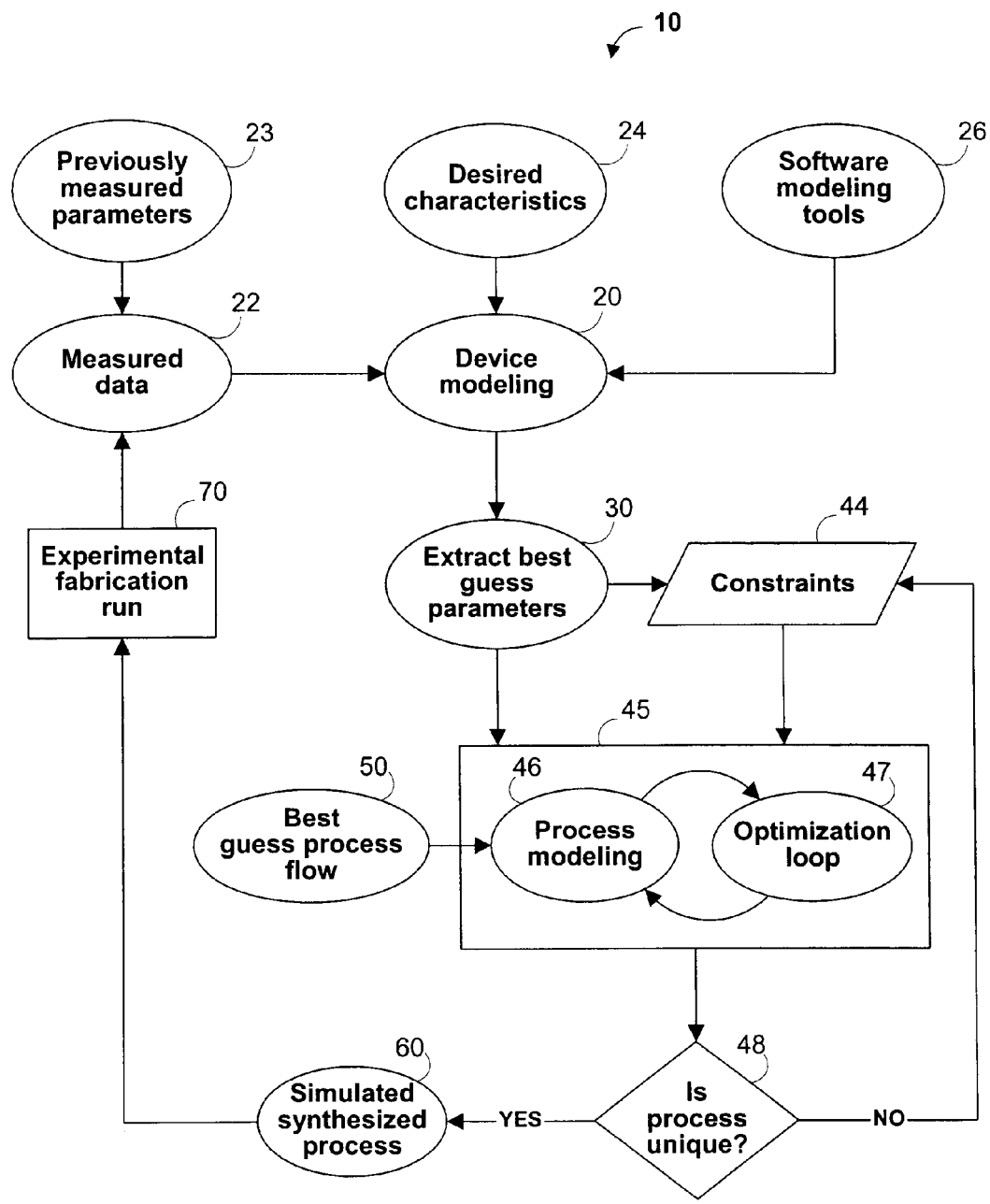
FIG. 1 illustrates an embodiment of an inverse modeling process that synthesizes unique process flow models according to the invention.

FIG. 1 illustrates an embodiment of a method to synthesize a model of a process flow in accordance with the invention. Step 20 represents the beginning of synthesizing method 10 and uses previously acquired information and modeling tools to model a device having desired characteristics defined by a user. At step 30, the synthesis process extracts best-guess parameters from the modeled device of step 20. These parameters provide the basis in which the inverse modeling technique is used to model process flows. After the parameters are extracted, the synthesis process builds a process flow model via steps 44–48. When the process flows are modeled, they are preferably simulated at step 60. After satisfactory simulation, the synthesized process flow can be implemented in an experimental fabrication run at step 70. Measured data from an experimentally fabricated device is then fed back into synthesis method 10 at step 22 either to further refine the current process flow model or to be used in the synthesis of other process flow models.

Device modeling at step 20 provides the invention with the ability to accurately model any semiconductor device. For example, a user may model a device that has already been manufactured. Step 20 may model improvements on existing devices or model new devices. Steps 22 and 24 provide important data to step 20 for modeling a desired device.

Step 22 provides measured data to step 20 to give step 20 a sufficient basis for modeling a device. If a user is constructing a transistor, the data provided by step 22 may include both physical, electrical, and other tangible characteristics of known transistors. The quantity of device characteristics provided to step 20 can range from just one to several hundred thousand. For example, a few physical characteristics that can be provided are transistor sizes, physical channel lengths, effective channel lengths, oxide thicknesses, and well depths. Electrical characteristics may include, for example, turn-ON voltages, blocking voltages, turn-ON resistances, and other electrical parameters. Step 22 can receive device characteristics from previously manufactured devices or from a device manufactured experimentally with a process previously modeled by the invention.

Step 23 may provide step 22 with characteristics and parameters previously measured from manufactured devices. These characteristics and parameters may be stored in a database. Because multiple devices may be stored in a database, several different values for the same parameters may exist. For example, if two MOSFETS are stored in the database, one may have an oxide thickness of 40 angstroms, and the other may have a thickness of 32 angstroms. Having several different values for the same parameter may provide step 20 with several options when modeling a desired device. An abundance of information may be useful in step 20 to obtain a best fit model for a desired device.

The data stored in steps 22 and 23 may be stored as vectors. Storing data as a vector provides step 20 with the ability to manipulate vast quantities of data efficiently when modeling an ideal device. Furthermore, the stored data may be stored in arrays of vectors. This may provide step 20 with the ability to use iteration techniques such as Gauss, Newton-Raphson, Gauss-Seidel, or other suitable iteration techniques.

Step 20 also receives information from step 24. At step 24, a user may input one or more desired device characteristics at a user interface. For example, a user may wish to construct a transistor that has a turn-ON voltage of 0.4 volts, operates with blocking voltage of 4 volts, has an overall length of 0.2 microns, and other desired parameters. Any number of parameters can be submitted for modeling at step 20. For example, several hundreds or thousands of different device parameters may be submitted. The information provided by step 24 provides step 20 with a foundation for the device modeling process. At step 20, the process analyzes the data provided by steps 22 and 23 to model a device that best fits the desired characteristics provided by step 24.

Step 26 may provide one or more software modeling tools or techniques to step 20 for analyzing the data (provided by step 22) and for modeling a device that most closely exhibits the user's desired parameters (provided by step 24). Step 26 may, for example, provide software models (e.g., software representations of physical models), numerical techniques, calibration techniques, metrology techniques, or any other suitable modeling tool that can be used at step 20. Step 20 may use a combination of such modeling tools from step 26 to model a desired device.

Software models provide a template from which accurate device models can be constructed. Several different software models may be provided by step 26. Some of these models may be specifically designed to model devices pertinent to desired characteristics prescribed by a user. Other software models may be more general and can also be used to model a desired device. However, the accuracy of the modeled device may be limited by the software model used to model the device. Thus, it is important to ensure that the right model is used when developing a desired device. Numerical techniques may be used to determine the accuracy of the software model used when modeling the desired device.

Numerical techniques may be used to approximate various parameters of a desired device model. Numerical techniques may include the use of iterative number manipulation. As briefly mentioned above, iterations such as a Gauss iteration are particularly useful for "sifting" through a large quantity of data. For example, assume that a user desires to construct a device that has one hundred distinct parameters. By using an iterative technique, step 20 may undergo multiple iterations until it converges to a result that best matches these desired device parameters.

Another example of a numerical technique is an iterative error minimization technique. Using this technique, a modeled parameter is compared to an actual parameter to obtain an error (e.g., difference between actual and modeled parameters). If the error is below a predetermined level, the model tool successfully modeled the device, at least for this parameter. This technique may then be applied for each parameter used to model the device. If the error is above a predetermined level, the model tool failed to accurately model the device, at least for this parameter. If each parameter is acceptable, then the device model may be suitable for use in the inverse modeling technique.

Iterative numerical techniques are useful because they typically converge to a single result. Sometimes, during the iterative process, the convergence "stalls" at two or more best fit models. If this occurs, additional selection criteria may be taken into account to force the iteration to converge to a single result. For example, if several best-guess models are provided in response to a numerical technique, a metrology technique may be used to estimate the best guess. Metrology is the science of weights and measures. Metrology techniques such as, for example, a secondary ion masked spectroscopy (SIMS) technique, a spreading resistance profiling (SRP) technique, and a scanning capacitance spectroscopy (SCS) technique are used to determine which models exhibit strengths that outweigh the other models. Using these techniques, the best guess models can be compared with predetermined criteria to determine which best guess model is suitable for a particular application.

For example, consider the modeling of a one-dimensional boron implant profile. Once the implant profile is modeled, data obtained from the model may be compared to known boron implant profiles using a methodology technique. If the SIMS methodology is used, a chemical concentration of the implant profile is ascertained. Whereas, if a SRP or a SCS methodology is used, an electrical concentration of the implant profile is obtained.

Persons skilled in the art will appreciate that metrology techniques can be applied to any modeling tool used to model a device, and not just numerical technique tools.

Step 26 may also provide calibration methodologies for use in modeling a device. Calibration methodologies can be used to calibrate or set up a model (e.g., a physical model) before desired device characteristics are modeled. Calibration of models may be necessary so that accurate best-guess models can be predicted based on the information provided to the model. For example, consider again the modeling of a one-dimensional boron implant profile. Further assume that a first simulation model is not calibrated and that a second simulation model is calibrated. When the first simulation is modeled, it may not produce a doping profile that accurately matches data measured from an actual boron implant profile. The second simulation, however, advantageously provides a doping profile that is substantially equal to the actual doping profile.

Step 20 thus initiates the inverse modeling process by modeling a desired model based on measured data, user defined characteristics, and device tools provided by steps 22, 24, and 26, respectively. Once the desired device is modeled, the invention extracts parameters associated with that model. These extracted parameters are used to model a process flow that can be used to fabricate that device.

Step 30 extracts the best-guess parameters from the modeled device. During the modeling process of step 20, certain parameters required for constructing such a device are provided to the process flow modeling steps. The parameters may include structural or physical dimensions, dopant levels, electrical properties, or any other tangible data. These parameters are then input to steps 44 and 45 for use in modeling process flows suitable for fabricating a desired device.

Step 44 selectively determines which parameters provided by step 30 should be used as constraints for modeling process flows. It is these constraints that limit and guide step 45 in modeling process flows. For example, constraints can include parameters such as temperature, pressure, and bake time. Step 44 preferably selects a minimum number of parameters necessary for use as constraints such that at least one unique process flow is modeled. One advantage of this invention is that the constraints selected by step 44 are configurable. That is, the number of constraints can be modified according to whether step 45 models one or more process flows. A more detailed discussion of step 44 and its ability to modify constraints is described below.

Step 45 uses the parameters derived from step 30 and the constraints selected by step 44 to model one or more process flows. Some of these process flow models may be relatively simple (e.g., a process flow module for obtaining a desired gate oxide thickness), while others can be complex (e.g., a process flow module for obtaining a desired effective channel length). Step 45 may model several independent modules of a complex process flow separately. Then, later in the process flow, these smaller modules are combined (e.g., at step 60). Regardless of the complexity of the process flow modeled, however, the inverse modeling process may model one or more process flows for a particular device characteristic. More than one modeled process flow may be provided because there is typically more than one way to fabricate a device that exhibits the same parameters and characteristics. The invention advantageously further synthesizes multiple process flows into a single unique process flow model in order to increase the likelihood that that unique process flow will successfully produce the desired results.

Before step 45 models a process flow, it may be provided with best-guess process flow models from step 50. Step 50 may contain process flows that were previously modeled or actually used in fabricating a particular device. Step 50 may provide a starting point at which step 45 models a unique process. Step 46, which is included in step 45, models the first and any subsequently modeled process flows. Step 46 uses the parameters provided by step 30 to model one or more process flows. In particular, step 46 models process flows that are based on the characteristics provided by the modeled desired device. Once step 46 models a process flow, it operates in conjunction with step 47, which optimizes existing models or causes step 46 to create new models.

Step 47 may selectively apply various techniques to enhance the accuracy of the modeled process flows. Step 47 accomplishes this by modifying the process models created at step 46 in accordance with the constraints selected in step 44. Therefore, step 47 may cause step 46 to remodel each process flow several times before the model is provided to step 48. Thus, an iterative optimization loop exists between steps 46 and 47. Step 47 optimizes each process flow so that it substantially embodies characteristics and limitations of process flows used in practice. Step 47 uses several techniques, described below, to accomplish this optimization.

A minimization error technique is implemented at step 47 to cause step 46 to model accurate process flows. This technique is substantially similar to the minimization error technique applied at step 20. This technique may minimize process-specific errors involved with, for example, obtaining a desired gate-oxide thickness, junction depth, effective channel length, or other suitable process-related characteristic. The minimization error may be quantified by using, for example, equation 1 as shown below:

$$\xi(p) = \frac{1}{N} \sum_{i=1}^{N} W_i^2 [x_i^{meas} - x_i^{model}(p)] \quad (1)$$

where p is a vector of process characteristics under consideration, N is the number of vectors, i represents the current vector being analyzed, W is a weighing function, and x is a data vector of measured/modeled values.

Using equation 1, the modeled process flow characteristics may be compared with measured process flow characteristics to determine whether the accuracy of the models is sufficient for fabricating a desired device. The accuracy of the process flow models may be quantified by an error vector, which is produced by the equation. This error vector provides a basis for determining whether the process flow needs further optimization. The error vector may also indicate the limits of the process model used. For example, assume that a user intends to design a device having a turn-ON voltage of 700 mV. Then during the modeling process, one particular model simulates process flows that result in devices having a 760 mV turn-ON voltage. This particular model may have utilized several other optimization techniques, but is still not capable of modeling the requisite process flow to fabricate a device that has a 700 mV turn-ON voltage. Thus, the error vector may provide an indication that this particular model cannot achieve the desired result.

A metrology technique is preferably used to determine an optimal balance among the constraints required to obtain the desired device characteristics. Because there may be several parameters that dictate the outcome of the modeled process flow, certain parameters may have more importance than others. A metrology technique assigns varying degrees of importance to each parameter used in modeling a process flow. Step 46 models process flows in accordance with the weighted importance assigned to each parameter in step 47.

For example, assume that a user wants to design a device having a gate length of 2 μm. Also assume that step 44 determined that the appropriate constraints are transconductance, threshold voltage, depletion capacitance, subthreshold conductance, bake time, pressure, and temperature. Then, relying on previously acquired data, best guess values are assigned to each parameter. Each of these parameters are then assigned a value indicating its degree of importance in modeling a process flow. If step 47 weighs parameters time, pressure, and temperature more heavily than the other parameters, step 46 will take this into account when modeling a new process flow or when updating an existing process flow model.

Step 47 may also provide a technique that calibrates the tools used in step 46. Occasionally, a tool may not accurately model a particular process flow. Therefore, it may be necessary to calibrate the tool to counteract any deficiencies associated with that tool. Thus, by calibrating the tool, the resulting process flow models may be accurate enough to fabricate the desired device or characteristic.

Step 47 may yet use another technique that provides a process simulation recipe to step 46. A simulation recipe may attach a numerical value or a range of values to each constraint selected by step 44. The simulation recipe may provide additional information that enables step 46 to accurately model process flows. The values associated with the parameters may define the limits or tolerances of critical parameters used for the modeling process. For example, if one of the constraints is temperature, step 47 provides step 46 with a temperature range. When step 46 begins to model a process flow, this temperature range may provide a specific constraint.

Persons skilled in the art will appreciate that the iterative process occurring between steps 46 and 47 may utilize any suitable technique to further optimize process flows. It should be further understood that this iterative process can implement several different techniques simultaneously to optimize process flows. For example, during the course of one iterative loop, step 46 may use the recipe technique, calibration technique, metrology technique, minimization error technique, and any other suitable optimization technique to model best-fit process flows.

When step 45 has finished modeling process flows, synthesizing method 10 proceeds to step 48. At step 48, each process flow model is tested to determine if it is unique. A process flow is unique if it provides the user with a specific process flow model that can be used to fabricate a desired device. As mentioned above, the inverse modeling process can provide several process flows. A unique process flow obviates the need for a user to consider each flow generated in step 45. This may save time and money because only the unique process flow would be implemented for experimental device fabrication as opposed to implementing several process flows provided by step 45.

A process flow model is unique if it closely matches a particular set of constraints, such as those provided by step 44. The closeness of the match may be determined by an algorithm or other suitable mathematical tool. Such an algorithm is preferably flexible such that a degree of closeness can be adjusted when determining whether a process flow model is unique.

Figure 2:
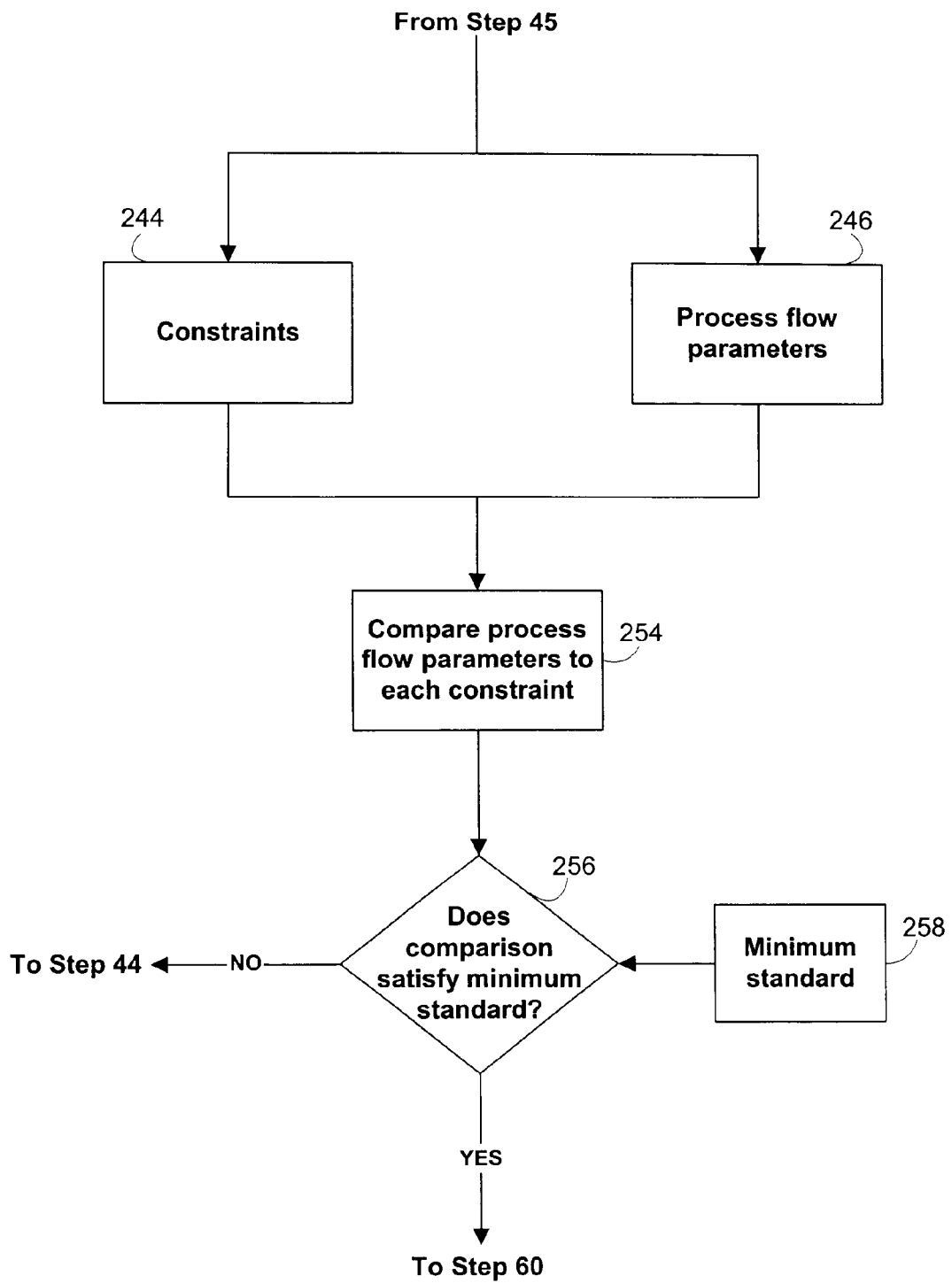
FIG. 2 illustrates an embodiment of a process for determining whether a process flow is unique according to the invention.

FIG. 2 illustrates a method of determining whether process flow models are unique in accordance with the invention. Initially, determination of a model's uniqueness begins by receiving process flow parameters and constraints from step 45. Step 244 represents the constraints selected by step 44. Step 246 represents the process flow parameters developed in connection with step 45.

Step 254 receives the information from both steps 244 and 246, and compares that information to determine which flows best match the constraints. The best match determination may be subjective because the closeness of the match (between a process flow and the constraints) can vary. This variation may provide step 256 with flexibility in determining which process flows are unique. In particular, step 256 may determine a process flow unique if it satisfies a minimum closeness standard. The minimum closeness standard is provided by step 258 and may be set by a user or it may be set by synthesis method 10. This standard may then be modified (e.g., the minimum standard may be made more stringent or relaxed). If the match between a process flow and the constraints satisfies the minimum standard, the process flow is unique. Once the process flow is found to be unique, the process proceeds to step 601. Conversely, if the process flow is not unique, the process may loop back to step 44.

Determination of process flow model uniqueness is illustrated in the following example. Consider that step 45 produces five process flows. Assume that four of these flows are marginal and one is satisfactory. Initially, the degree of closeness may be set relatively high (i.e., to find uniqueness, the modeled process flow should be substantially similar to the predetermined constraints). Because the degree of closeness is set relatively high, each of the process flows may be determined not unique. However, if the degree of closeness (e.g., minimum standard of step 258) is relaxed, the satisfactory process flow may qualify as a unique process flow. Thus, synthesis process 10 can use "minimum standard" criteria to determine uniqueness.

Synthesis method 10 can use other criteria to enable step 45 to model unique process flows. Step 44, for example, can reconfigure the constraints it provides to step 45. Referring back to FIG. 1, step 44 selectively determines which parameters will be used as constraints. Depending on the complexity of the modeled device, step 44 can select from a substantial list of parameters to generate constraints. For example, assume that a user wants to construct a device with a predetermined gate oxide thickness. In this example, step 44 may initially select the parameters temperature, pressure, and bake time. These parameters are then used to model a process flow at step 45. If more than one process flow model results, step 44 may add another constraint (e.g., junction depth) to further restrict the number of process flows modeled. Additional constraints restrict the number of process flows modeled by step 45 and also increases the likelihood that step 45 models unique process flows.

In an alternative approach, step 44 may exchange one or more constraints previously provided to step 45 with one or more different constraints. This provides added flexibility to the modeling process. For example, again consider the gate oxide thickness example above. Assume that step 44 has selected the parameters temperature, pressure, bake time, and junction depth and that multiple process flows are still modeled. If step 44 exchanges a constraint, it may substitute a channel length parameter in place of the junction depth parameter. Thus, a combination of temperature, pressure, bake time, and channel length parameters may provide a sufficient combination of constraints to enable step 45 to model a unique process flow. The feedback loop that exists between steps 48 and 44 continues repeatedly for a specified number of loops until a unique process flow is found. During this feedback process, various constraints may be added, deleted, or exchanged at step 44. If the feedback loop is not able to generate a unique process flow model within the specified number of loops, synthesis method 10 terminates the process and notifies the user of the multiple process models.

Step 44 may also take into consideration the limitations of tools used to fabricate devices when selecting constraints. If devices used during the fabrication process are not capable of providing a desired function, modeling a process flow that requires such a function would be unreasonable. Thus, step 44 may take these limitations into consideration when selecting parameters as constraints.

Because the invention advantageously can model specific portions of a general more complex process flow, the invention can optionally combine models of several unique process flow portions into a single model of a complete process flow that incorporates at least some of the characteristics of each unique portion.

Figure 3:
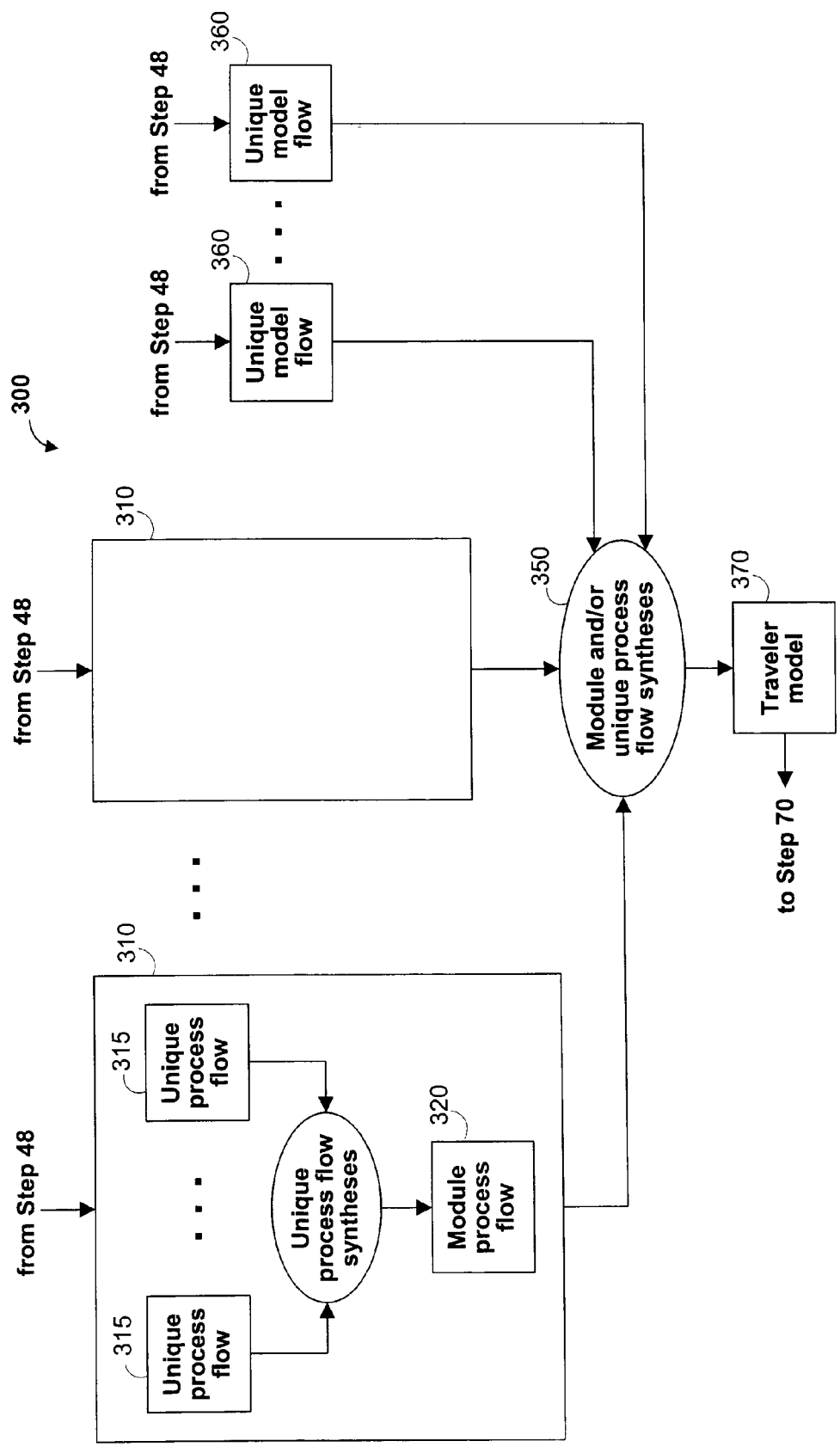
FIG. 3 illustrates a process for synthesizing two or more unique partial process flow models into a complete process flow model according to the invention.

FIG. 3 illustrates the modeling of one or more unique process flows into a complete process flow that can be implemented in an experimental fabrication run to produce a desired device. Modeling process 300 includes one or more module steps 310, one or more unique model flows 360, and module synthesis process step 350. Each module step 310 provides a module process flow 320 which is synthesized with other module process flows 320 at step 350.

Each module step 310 synthesizes two or more unique process flows 315 (provided by step 48 of FIG. 1) at unique process flow synthesis step 317. Process flows 315 typically represent unique process flows that were modeled to produce a specific characteristic of a desired device. Step 317 then synthesizes each of these models by incorporating several features of each process flow to model module process flow 320.

Module step 310 operates as follows. For example, assume that step 310 is provided with two unique process flows that estimate the gate oxide thickness of a device based on different parameters. The first flow may estimate a gate oxide thickness based on, for example, a particular ION/OFF characteristic. The second flow may estimate a gate oxide thickness based on a hot-carrier reliability characteristic. When these two different process flows are synthesized at step 317, they are "molded" into module process flow 320 having features of both unique process flows.

If synthesis method 10 models only one unique model flow 360 for a specific portion of a general process flow model, then that model bypasses module step 310 and is passed directly to step 350. Step 350 synthesizes any combination of module process flows 320 and unique model flows 360 to traveler model 370. A traveler model is a model that is suitable for implementation in an actual fabrication run. When traveler model 370 is complete, synthesis method 10 has completed modeling a process flow that is suitable for experimentally fabricating the device modeled in step 20 (as shown in FIG. 1). After traveler model 370 is modeled, synthesis method 10 proceeds to step 70 of FIG. 1.

Step 70 allows the user to select a particular type of wafer on which a desired device can be fabricated by implementation of a traveler model. The particular type of wafer used may depend on the process flow modeled in step 60. For example, a user can select a wafer that is suitable for a full flow experiment (e.g., a complete process flow that creates an integrated circuit). In another example, the user can select a wafer for a short process flow experiment (e.g., a process flow that creates a portion of an integrated circuit).

When the modeled process flow of step 60 is put into practice and a device is fabricated, the results of that fabrication are provided to step 22. This creates a feedback loop that can increase the efficiency and accuracy of synthesis method 10. The data obtained from the fabricated device can be compared to the original design parameters to determine the accuracy of the modeled process flow. The results of the fabricated device can be incorporated into future process flow predictions.

It will be understood that the steps shown in FIG. 1 are exemplary and that additional steps may be added while some of the steps may be omitted. For example, a step indicating a user interface to input desired device characteristics can be included in synthesis method 10.

One advantage of the invention is that it can be implemented on any suitable computer system. Preferably, the invention is implemented on workstation-based computer systems. When operating on such a computer system, the invention can model process flows quickly and accurately. The workstations are preferably interconnected such that multi-tasking operations can be run simultaneously. For example, multi-tasking operations may include use of multiple processors, parallel processing, distributive processing, or any other suitable processing scheme. Networked machines may be polled to determine which machines have sufficient resources available to perform a desired task.

In one approach, the multiple processing scheme may simultaneously synthesize different portions of synthesis method 10. In this approach, the invention can use several processors to model several specific portions (e.g., gate oxide thickness, doping profile, channel length, etc.) of a process flow at substantially the same time. For example, one processor may be dedicated to modeling the gate oxide thickness and another processor may be dedicated to modeling the doping profile. Thus, several separate processors can synthesize a process more quickly than a single processor.

Those skilled in the art will appreciate that many types of computer systems can be used to implement the invention. For example, a mainframe, a supercomputer, a home personal computer, or an APPLE based computer system may be used. Preferably, the computer system is a UNIX based system such as an Ultra 60 workstation, sold by Sun Microsystems, of Palo Alto, Calif. UNIX based workstations are preferable because they readily operate with Technology Computer-Aided Designs (TCAD).

Thus it is seen that semiconductor process flows suitable for fabricating a desired semiconductor device can be modeled. Those skilled in the art will appreciate that the invention can be practiced by other than the described embodiments, which are presented for purposes of illustration rather than of limitation, and the invention is limited only by the claims which follow.

I claim:

1. A method of modeling semiconductor process flows in software, said method comprising:

modeling a desired semiconductor device to be fabricated;

extracting data from said modeled semiconductor device;

generating at least one semiconductor process flow based on said extracted data;

determining whether said at least one semiconductor process flow satisfies predetermined constraints; and synthesizing a unique semiconductor process flow based on said at least one semiconductor process flow determined to satisfy said predetermined constraints.

2. The method of claim 1 wherein said predetermined constraints are selected from said extracted data.

3. The method of claim 1 wherein said generating is based on at least one of said predetermined constraints.

4. The method of claim 1 further comprising receiving at least one modeling methodology that optimizes the accuracy of said parameters extracted from said modeled device.

5. The method of claim 4, wherein said at least one modeling methodology comprises a metrology technique selected from the group consisting of a secondary ion masked spectroscopy technique, a spread resistance profiling technique, a scanning capacitance spectroscopy technique, and any combination thereof.

6. The method of claim 1 wherein said device is modeled on at least one electrical characteristic.

7. The method of claim 6 wherein said at least one electrical characteristic is transistor turn-ON voltage.

8. The method of claim 1 wherein said device is modeled on at least one physical characteristic.

9. The method of claim 8 where said at least one physical characteristic is transistor size.

10. The method of claim 1 further comprising using computer-aided design tools to perform said modeling a semiconductor device, said extracting, said determining, said generating, and said synthesizing.

11. The method of claim 1 wherein said synthesizing comprises combining characteristics of each of said at least one semiconductor process flows.

12. The method of claim 1 wherein said synthesizing comprises:

constructing at least two module models; and combining said at least two module models to form a combined model.

13. A system for modeling semiconductor process flows, said system comprising computer equipment configured to:

model a desired semiconductor device to be fabricated;

extract data from said modeled semiconductor device;

generate at least one semiconductor process flow based on said extracted data;

determine whether said at least one semiconductor process flow satisfies predetermined constraints; and synthesize a unique semiconductor process flow based on said at least one semiconductor process flow determined to satisfy said predetermined constraints.

14. The system of claim 13 wherein said predetermined constraints are selected from said extracted data.

15. The system of claim 13 wherein the computer equipment is further configured to generate said at least one process flow based on at least one of said predetermined constraints.

16. The system of claim 13 wherein the computer equipment is further configured to provide at least one modeling methodology that optimizes the accuracy of said parameters extracted from said modeled device.

17. The system of claim 16 wherein said at least one modeling methodology comprises a metrology technique selected from the group consisting of a secondary ion masked spectroscopy technique, a spread resistance profiling technique, a scanning capacitance spectroscopy technique, and any combination thereof.

18. The system of claim 13 wherein said computer equipment is further configured to model said device based on at least one electrical characteristic.

19. The system of claim 18 wherein said at least one electrical characteristic is transistor turn-ON voltage.

20. The system of claim 13 wherein said computer equipment is further configured to model said device based on at least one physical characteristic.

21. The system of claim 20 wherein said at least one physical characteristic is transistor size.

22. The system of claim 13 wherein the computer equipment is further configured to use computer-aided design tools to perform said modeling.

23. The system of claim 13 wherein the computer equipment is further configured to synthesize a plurality of said unique process flow models into a single process flow model that includes characteristics of each of said unique process flows.

24. The system of claim 13 wherein the computer equipment is further configured to:

construct at least two module models; and combine said at least two module models to form a combined model.

25. Apparatus for modeling semiconductor process flows in software, said apparatus comprising:
    means for modeling a desired semiconductor device to be fabricated;
    means for extracting data from said modeled semiconductor device;
    means for generating at least one semiconductor process flow based on said extracted data;
    means for determining whether said at least one semiconductor process flow satisfies predetermined constraints; and
    means for synthesizing a unique semiconductor process flow based on said at least one semiconductor process flow determined to satisfy said predetermined constraints.

26. The apparatus of claim 25 wherein said predetermined constraints are selected from said data.

27. The apparatus of claim 25 further comprising means for optimizing said generating based on at least one of said predetermined constraints.

28. The apparatus of claim 25 further comprising means for receiving at least one modeling methodology that optimizes the accuracy of said parameters extracted from said modeled device.

29. The apparatus of claim 28, wherein said at least one modeling methodology comprises a metrology technique selected from the group consisting of a secondary ion masked spectroscopy technique, a spread resistance profiling technique, a scanning capacitance spectroscopy technique, and any combination thereof.

30. The apparatus of claim 25 wherein said device is modeled on at least one electrical characteristic.

31. The apparatus of claim 30 wherein said at least one electrical characteristic is transistor turn-ON voltage.

32. The apparatus of claim 25 wherein said device is modeled on at least one physical characteristic.

33. The apparatus of claim 32 where said at least one physical characteristic is transistor size.

34. The apparatus of claim 25 further comprising means for using computer-aided design tools to perform said modeling, said extracting, said determining, said generating, and said synthesizing.

35. The apparatus of claim 25 wherein said means for synthesizing comprises combining characteristics of each of said at least one semiconductor process flows.

36. The apparatus of claim 25 wherein said means for synthesizing comprises:
    means for constructing at least two module models; and
    means for combining said at least two module models to form a combined model.

37. A method of modeling a unique semiconductor process flow suitable for fabricating a semiconductor device, said method comprising:
    receiving desired physical and electrical characteristics of said semiconductor device;
    modeling said device based on said desired characteristics;
    generating parameters indicative of said modeled device;
    selecting design and manufacturing constraints based on said generated parameters;
    modeling at least one process flow based on said generated parameters and said selected constraints;
    determining if said at least one modeled process flow satisfies said selected constraints; and
    synthesizing said at least one unique process flow determined to satisfy said selected constraints to model said unique semiconductor process flow.

38. The method of claim 37 further comprising optimizing said at least one modeled process flow such that said at least one process flow substantially conforms to said selected constraints.

39. The method of claim 38 wherein said optimizing comprises using a technique selected from the group consisting of a metrology technique, an error-minimization technique, a model calibration technique, and a recipe technique.

40. The method of claim 37 wherein said selecting comprises selecting different design and manufacturing constraints if none of said modeled process flows are unique, said method further comprising:
    remodeling at least one process flow based on said generated parameters and said different selected constraints;
    determining if said at least one remodeled process flow is unique; and
    synthesizing said at least one unique process flow to model said unique semiconductor process flow.

41. The method of claim 40 further comprising optimizing said at least one remodeled process flow such that said at least one process flow substantially conforms to said different selected constraints.

42. The method of claim 37 wherein said determining further comprises:
    comparing parameters of one of said modeled process flows to the selected constraints;
    determining if the comparison satisfies a standard; and
    providing said process flow to said synthesis step if said comparison satisfies said standard.

43. The method of claim 42 wherein said standard is set by a user.

44. The method of claim 42 wherein said standard is set by a computer program performing said method.

45. The method of claim 42 further comprising adjusting said standard.

46. The method of claim 37 wherein said synthesizing comprises:
    modeling a first module from a first set of unique process flows, wherein said first set of unique process flows are directed towards fabricating a particular portion of said device;
    modeling a second module from a second set of unique process flows, wherein said second set of unique process flows are directed towards fabricating a different portion of said device; and
    synthesizing said first module and said second module to model said unique semiconductor process flow.

47. The method of claim 46 further comprising synthesizing a third module with said first module and said second module to model said unique semiconductor process flow.

48. The method of claim 46 further comprising synthesizing at least said first module and said second module to model said unique semiconductor process flow.

49. The method of claim 37 further comprising allowing a user to select a silicon wafer upon which the said unique semiconductor process flow is implemented.

50. The method of claim 37 further comprising feeding back results of an actual fabrication run based on said semiconductor process flow model.

51. The method of claim 37 further comprising receiving previously measured data, wherein at least some of said previously measured data is input to said modeling said device.

52. A system for modeling a unique semiconductor process flow suitable for fabricating a semiconductor device, comprising computer equipment configured to:

receive desired physical and electrical characteristics of said semiconductor device;

model said device based on said desired characteristics;

generate parameters indicative of said modeled device;

select design and manufacturing constraints based on said generated parameters;

model at least one process flow based on said generated parameters and said selected constraints;

determine if said at least one modeled process flow satisfies said selected constraints; and synthesize said at least one unique process flow determined to satisfy said selected constraints to model said unique semiconductor process flow.

53. The system of claim 52 wherein the computer equipment is further configured to optimize said at least one modeled process flow such that said at least one process flow substantially conforms to said selected constraints.

54. The system of claim 52 wherein the computer equipment is further configured to optimize said at least one modeled process flow using a technique selected from the group consisting of a metrology technique, an error-minimization technique, a model calibration technique, and a recipe technique.

55. The system of claim 52 wherein said computer equipment is further configured to select different design and manufacturing constraints if none of said modeled process flows are unique, said computer equipment is further configured to:

remodel at least one process flow based on said generated parameters and said different selected constraints;

determine if said at least one remodeled process flow is unique; and synthesize said at least one unique process flow to model said unique semiconductor process flow suitable for fabricating a semiconductor device.

56. The system of claim 55 wherein said computer equipment is further configured to optimize said at least one remodeled process flow such that said at least one process flow substantially conforms to said different selected constraints.

57. The system of claim 52 wherein said computer equipment is further configured to:

compare parameters of one of said modeled process flows to said selected constraints;

determine if the comparison satisfies a standard; and provide said process flow to said synthesis step if said comparison satisfies said standard.

58. The system of claim 57 wherein said standard is set by a user.

59. The system of claim 57 wherein said standard is set by a software program.

60. The system of claim 58 wherein said computer equipment is further configured to adjust said standard.

61. The system of claim 52 wherein said computer is further configured to:

model a first module from a first set of unique process flows, said first set of unique process flows directed to fabricating a particular portion of said device;

model a second module from a second set of unique process flows, said second set of unique process flows directed to fabricating a different portion of said device; and synthesize said first module and said second module to model said unique semiconductor process flow.

62. The system of claim 61 wherein said computer equipment is further configured to synthesize a third module with said first module and said second module to model said unique semiconductor process flow.

63. The system of claim 61 wherein said computer equipment is further configured to synthesize at least said first module and said second module to model said unique semiconductor process flow.

64. The system of claim 52 wherein said computer equipment is further configured to allow a user to select a wafer upon which said unique semiconductor process flow is implemented.

65. The system of claim 52 wherein said computer equipment is further configured to feed back results of an actual fabrication run based on said semiconductor process flow model.

66. The system of claim 52 wherein said computer equipment is further configured to receive previously measured data, at least some of said previously measured is input said modeling said device.

67. Apparatus for modeling a unique semiconductor process flow suitable for fabricating a semiconductor device, said apparatus comprising:

means for receiving desired physical and electrical characteristics of said semiconductor device;

means for modeling said device based on said desired characteristics;

means for generating parameters indicative of said modeled device;

means for selecting design and manufacturing constraints based on said generated parameters;

means for modeling at least one process flow based on said generated parameters and said selected constraints;

means for determining if said at least one modeled process flow satisfies said selected constraints; and means for synthesizing said at least one unique process flow determined to satisfy said selected constraints to model said unique semiconductor process flow.

68. The apparatus of claim 67 further comprising means for optimizing said at least one modeled process flow such that said at least one process flow substantially conforms to said selected constraints.

69. The apparatus of claim 68 wherein said means for optimizing comprises means for using a technique selected from the group consisting of a metrology technique, an error-minimization technique, a model calibration technique, and a recipe technique.

70. The apparatus of claim 67 wherein said means for selecting comprises means for selecting different design and manufacturing constraints if none of said modeled process flows are unique, said apparatus further comprising:

means for remodeling at least one process flow based on said generated parameters and said different selected constraints;

means for determining if said at least one remodeled process flow is unique; and means for synthesizing said at least one unique process flow to model said unique semiconductor process flow suitable for fabricating a semiconductor device.

71. The apparatus of claim 70 further comprising means for optimizing said at least one remodeled process flow such that said at least one process flow substantially conforms to said different selected constraints.

72. The apparatus of claim 67 wherein said means for determining further comprises:

means for comparing parameters of one of said modeled process flows to the selected constraints;

means for determining if the comparison satisfies a standard; and means for providing said process flow to said synthesis step if said comparison satisfies said standard.

73. The apparatus of claim 72 wherein said standard is set by a user.

74. The apparatus of claim 72 wherein said standard is set by a computer program operating said method.

75. The apparatus of claim 72 further comprising means for adjusting said standard.

76. The apparatus of claim 67 wherein said means for synthesizing comprises:

means for modeling a first module from a first set of unique process flows, said first set of unique process flows directed to fabricating a particular portion of said device;

means for modeling a second module from a second set of unique process flows, said second set of unique process flows directed to fabricating a different portion of said device; and means for synthesizing said first module and said second module to model said unique semiconductor process flow.

77. The apparatus of claim 76 further comprising means for synthesizing a third module with said first module and said second module to model said unique semiconductor process flow.

78. The apparatus of claim 76 further comprising means for synthesizing at least said first module and said second module to model said unique semiconductor process flow.

79. The apparatus of claim 67 further comprising means for allowing a user to select a wafer upon which said unique semiconductor process flow is be implemented.

80. The apparatus of claim 67 further comprising means for feeding back results of an actual fabrication run based on said semiconductor process flow model.

81. The apparatus of claim 67 further comprising means for receiving previously measured data, wherein at least some of said previously measured data is input to said modeling said device.

82. A method of modeling a semiconductor process flow, said method comprising:

providing a feedback loop that determines whether a process flow satisfies predetermined constraints, said feedback loop comprising:

selecting at least one design and manufacturing constraint from a plurality of parameters, and modeling a semiconductor process flow based on said selected constraints and said parameters;

continuing said feedback loop when said process flow does not satisfy said selected constraints; and ceasing said feedback loop when said process flow does satisfy said selected constraints.

83. The method of claim 82 wherein said feedback loop further comprises best fitting said semiconductor process flow to said at least one design and manufacturing constraint.

84. The method of claim 82 wherein said feedback loop further comprises optimizing said semiconductor process flow such that said semiconductor process flow substantially conforms to said at least one selected constraint.

85. The method of claim 82 wherein said selecting comprises at least one of:

adding additional constraints;

exchanging a different constraint for a previously selected constraint; and deleting a previously selected constraint before said semiconductor process flow is modeled.

86. A system for modeling a semiconductor process flow, said system comprising computer equipment configured to:

provide a feedback loop that determines whether said semiconductor process flow satisfies predetermined constraints, said feedback loop configured to:

select at least one design and manufacturing constraint from a plurality of parameters, and model said semiconductor process flow based on said selected constraints and said parameters;

continue said feedback loop when said process flow does not satisfy said selected constraints; and cease said feedback loop when said process flow does satisfy said selected constraints.

87. The system of claim 86 wherein said feedback loop is further configured to best fit said semiconductor process flow to said at least one design and manufacturing constraint.

88. The system of claim 86 wherein said feedback loop is further configured to optimize said semiconductor process flow such that said semiconductor process flow substantially conforms to said at least one selected constraint.

89. The system of claim 86 wherein said feedback loop is further configured to perform at least one of:

add additional constraints;

exchange a different constraint for a previously selected constraint; and delete a previously selected constraint before said semiconductor process flow is modeled.

90. Apparatus for modeling a semiconductor process flow, said apparatus comprising:

means for providing a feedback loop that determines whether a process flow satisfies predetermined constraints, said feedback loop comprising:

means for selecting at least one design and manufacturing constraint from a plurality of parameters, and means for modeling a semiconductor process flow based on said selected constraints and said parameters;

means for continuing said feedback loop when said process flow does not satisfy said selected constraints; and means for ceasing said feedback loop when said process flow does satisfy said selected constraints.

91. The apparatus of claim 90 wherein said feedback loop further comprises means for best fitting said semiconductor process flow to said at least design and manufacturing constraints.

92. The apparatus of claim 90 wherein said feedback loop further comprises means for optimizing said semiconductor process flow such that said semiconductor process flow substantially conforms to said at least one selected constraint.

93. The apparatus of claim 90, wherein said means for selecting comprises at least one of:

means for adding additional constraints;

means for exchanging a different constraint for a previously selected constraint; and means for deleting a previously selected constraint before said semiconductor process flow is modeled.

* * * * *

UNITED STATES PATENT AND TRADEMARK OFFICE
CERTIFICATE OF CORRECTION

PATENT NO. : 6,772,035 B2
DATED : August 3, 2004
INVENTOR(S) : Chandra V. Mouli

It is certified that error appears in the above-identified patent and that said Letters Patent is hereby corrected as shown below:

Title page,
Item [56], References Cited, OTHER PUBLICATIONS,
"Zachary K. Lee" reference, change "Inerse" to -- Inverse --.

Column 7,
Line 64, change "parameters time" to -- parameters such as time --.

Column 10,
Line 25, change "ION/OFF" to -- Ion/Ioff --.

Column 16,
Lines 19 and 20, change "measured is input said modeling said device" to -- measured data is input to said model said device --.

Signed and Sealed this

Eleventh Day of October, 2005

JON W. DUDAS
*Director of the United States Patent and Trademark Office*